(12) United States Patent
De Santis

(10) Patent No.: US 6,535,019 B2
(45) Date of Patent: Mar. 18, 2003

(54) SWITCHING CONTROL METHOD OF A LEVEL SHIFTER AND CORRESPONDING IMPROVED SELF-CONTROLLED LEVEL SHIFTER

(75) Inventor: Fabio De Santis, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/989,318

(22) Filed: Nov. 20, 2001

(65) Prior Publication Data

US 2002/0088995 A1 Jul. 11, 2002

(30) Foreign Application Priority Data

Nov. 22, 2000 (IT) .......................................... MI00A2514

(51) Int. Cl.[7] .......................................... H03K 19/0175
(52) U.S. Cl. ............................ 326/83; 326/68; 327/538
(58) Field of Search .......................... 326/80–83, 86–87, 326/68; 327/538, 540

(56) References Cited

U.S. PATENT DOCUMENTS 5,825,205 A * 10/1998 Ohtsuka ........................ 326/81
6,107,700 A * 8/2000 Ishikawa et al. ............. 307/116
6,323,687 B1 * 11/2001 Yano ............................. 326/83

* cited by examiner

Primary Examiner—Michael Tokar
Assistant Examiner—James H Cho
(74) Attorney, Agent, or Firm—Allen, Dyer, Doppelt, Milbrath & Gilchrist, P.A.; Lisa K. Jorgenson

(57) ABSTRACT

A switching control method for level shifter includes a phase of de-selection of a high voltage value at an output terminal of the shifter using a selection signal. The de-selection phase may include starting the de-selection by bringing the selection signal to a low value; de-activating by way of the selection signal, the generation of a high-voltage signal being supplied to the shifter, and a reference voltage signal; computing the difference between an internal voltage signal of the shifter and the reference voltage signal; generating a control signal when the difference is found to be less than a threshold voltage value; and applying the selection signal to an input terminal of the shifter in the presence of the control signal.

18 Claims, 4 Drawing Sheets

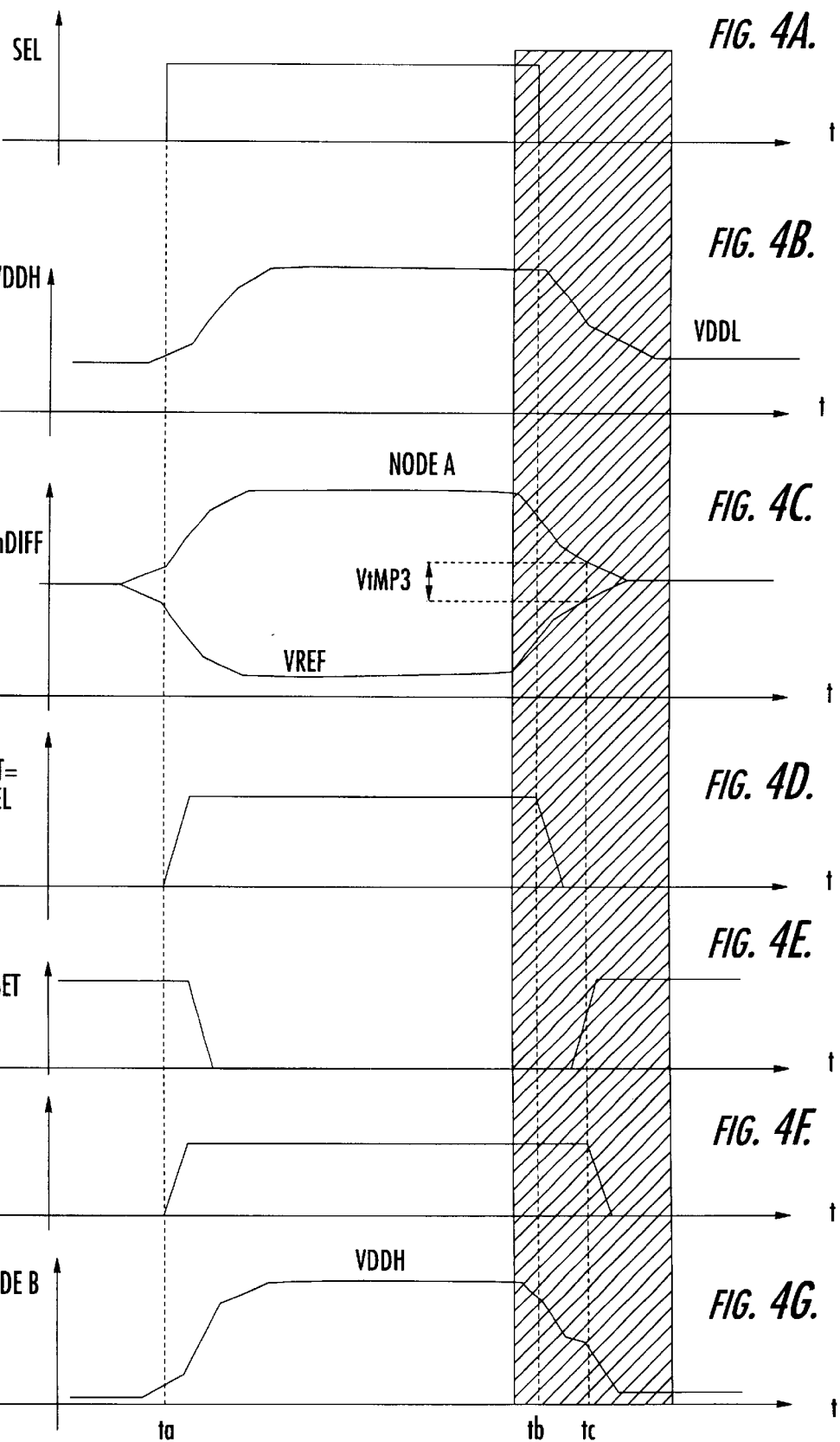

SWITCHING CONTROL METHOD OF A LEVEL SHIFTER AND CORRESPONDING IMPROVED SELF-CONTROLLED LEVEL SHIFTER

FIELD OF THE INVENTION

The present invention relates to a switching control method for a level shifter, as well as to a self-controlled level shifter, particularly for standard CMOS technology low-power references. The invention relates, particularly but not exclusively, to a CMOS technology application, and in the detailed description which follows reference will be made to this field of application for convenience of illustration only.

BACKGROUND OF THE INVENTION

As is well known, suitable transistors are not available to withstand a high potential across the drain-source junction, as well as at the gate terminal for devices used in low supply voltage processes. As a result, level shifters, e.g. of the cascode type, are usually used for transferring high voltage levels. In particular, VDDL denotes herein a nominal supply voltage level, in particular a low voltage level; VDDH denotes a high voltage level to be transferred; and VREF denotes a reference voltage level, needed to control the different steps of a generic cascode operation.

A conventional shifter of the cascode type is shown generally at 1 in FIG. 1, in schematic form. FIG. 1 illustrates schematically the generators, 2 and 3, respectively for the reference voltage VREF and the high voltage VDDH, only in terms of their operation. The generators 2 and 3 are driven by the same selection signal SEL.

The shifter 1 basically comprises a differential cell having an input section 4, comprising a first MOS transistor MN1 and a second MOS transistor MN2 and being connected to an input terminal IN of the shifter 1 and to a voltage reference, e.g. a ground reference GND. An output section 5, is also provided and comprises a third MOS transistor MP3 and a fourth MOS transistor MP4 and being connected to the input section 4, as well as to an output terminal OUT of the shifter 1 and to a reference node X, the latter receiving a reference voltage VREF. In addition, the shifter 1 also includes a biasing section 6, comprising a fifth MOS transistor MP5 and a sixth MOS transistor MP6 and being connected between the output section 5 and a high-voltage reference VDDH.

In particular, the first transistor MN1 of the input section 4 has a drain terminal connected to the output terminal OUT, a source terminal connected to ground GND, and a gate terminal connected to the input terminal IN through an inverter INV. A second transistor MN2 of the input section 4 has a drain terminal connected to a drain terminal of the fourth transistor MP4 of the output section 5, a source terminal connected to ground GND, and a gate terminal connected to the input terminal IN directly. Furthermore, the third transistor MP3 of the output section 5 has a source terminal connected to a first internal circuit node A, a drain terminal connected to the output terminal OUT of the shifter 1, and a gate terminal connected to the reference node X. The fourth transistor MP4 of the output section 5 has a source terminal connected to a drain terminal of the sixth transistor MP6 of the biasing section 6, a drain terminal connected to the drain terminal of the second transistor MN2 of the input section 4, and a gate terminal connected to the reference node X. Lastly, the fifth transistor MP5 of the biasing section 6 has a drain terminal connected to the first internal circuit node A, a source terminal connected to the high-voltage reference VDDH, and a gate terminal cross-connected to the drain terminal of the sixth transistor MP6. The latter has a source terminal connected to the high-voltage reference VDDH, and a gate terminal cross-connected to the drain terminal of the fifth transistor MP5, i.e. to the first internal circuit node A.

Thus, the third and fifth transistors MP3 and MP5, as well as the fourth and sixth transistors MP4 and MP6, are cascode connected. In particular, transistors MP3 and MP5 can be viewed as forming an output leg of the differential cell. The input terminal IN of the shifter 1 receives the selection signal SEL turning on the shifter, and also causing the generators 2, 3 to generate the voltage references VDDH and VREF. Finally, the second internal circuit node B is connected to an output terminal OUT of the shifter 1.

It will be now described what happens as the output terminal OUT is switched from a high voltage value VDDH over to a low voltage value VDDL, i.e. upon the high voltage VDDH being de-selected at the output terminal OUT. As shown schematically in FIGS. 2A to 2D, in a steady state, before the high voltage is de-selected at the output terminal OUT, i.e. within the time lapse from ta to tb shown in FIGS. 2A to 2D, the reference voltage VREF is a value such that the third transistor MP3 enters conduction. This is so while the potential differences between the gate and the drain terminals, |Vgd(MP3)|, and between the gate and the source terminals, |Vgs(MP3)|, of the third transistor MP3 are held below the highest admissible value, which is typically much lower than the high voltage value VDDH.

Therefore, the following relation applies generally:

$$VREF < VA - |Vth(MP3)|$$

where VA is the voltage at the first internal circuit node A, and Vth(MP3) is the threshold voltage of the third transistor MP3.

Under these conditions, the gate terminal of the first transistor MN1 has a low voltage value, and will not interfere with transferring the high voltage VDDH to the output terminal OUT. Thus, the high voltage VDDH will be distributed through the cascoded branch comprising the third and fifth transistors, MP3 and MP5, so that the transistor oxides and junctions are not overly stressed.

The situation is similar, but reversed, in the branch comprising the fourth and the sixth transistors, MP4 and MP6. At a time tb, when the selection signal SEL goes low, the high voltage VDDH at the output terminal OUT decreases, and concurrently therewith, the level of the reference voltage VREF goes high (typically but not necessarily to VDDL). In this way, the stress for the transistors in the structure is attenuated and the level shifter 1 turned off completely.

However, the selection of the first transistor MN1, which takes place upon its gate terminal going high, i.e. as the signal SEL on the input terminal IN goes low, will pull the output terminal OUT quickly to ground. This may produce a voltage drop of similar magnitude across the node X due to the capacitive coupling of the gate-drain capacitance Cgd(MP3) and source-gate capacitance Cgs(MP3) of the third transistor MP3 (FIG. 1).

Actually, the value of the voltage variation occurring at the output terminal OUT (from VDDH to 0V) may even pull the node X to negative voltage values, with the reference voltage VREF at node X being a fairly low value, even during the previous high-voltage phase, as shown in FIG. 2C. This produces stress on the gate oxides and makes correctly biasing the transistors of the shifter 1 more difficult to achieve.

This capacitive effect becomes larger, the larger the load on the output terminal OUT, as when a number of shifters are connected in parallel to the same node. Also, the dimensions W of the transistors MP1 and MP3 are proportional to the load to be driven. Thus, the output terminal OUT will have increased inertia, and the coupling between the output terminal OUT and the node X of the reference voltage VREF will be boosted by the dimensional increase of the transistors in shifter 1, as shown diagrammatically in FIG. 2D. However, a steadier reference voltage VREF generally involves circulation of a large current through its bias circuit (not shown because it is conventional), resulting in undesired static power consumption and increased power dissipation of the device where the shifter 1 is integrated.

This prior approach, although effective, has an inherent limitation in the operation of de-selection of the high voltage VDDH at the output terminal OUT of the shifter 1, due to the capacitive effects of the node X whereat the reference voltage VREF is, as required for cascode operation. This problem becomes more acute, the higher the drive capability required to the level shifter, i.e. the larger the load to be handled by the shifter.

SUMMARY OF THE INVENTION

An embodiment of this invention is directed to a switching control method avoiding the lowering of the reference voltage VREF described hereinabove when the output node of the shifter is switched. This result is obtained without the use of high power biasing for the reference voltage VREF.

The control method drives the phase of de-selection of the shifter output node initially at a high voltage, to only trigger it in after a condition of minimum coupling to the reference node X, whereat the reference voltage VREF is established. In this way, a low-power type of reference generator, having a reduced drive capability and relatively simpler design, can be used for this reference voltage.

This is achieved in a substantially "automatic" mode, i.e. with no need to provide additional external control signals. In particular, the control method allows the shifter to control itself. This is in the sense that it requires no external synchronization and employs an additional control circuit that comprises essentially a comparator driving a sequential circuit.

The switching control method comprises a phase of de-selection of a high voltage value at an output terminal of the shifter using a selection signal. The de-selection phase may comprise the following: starting the de-selection by bringing the selection signal to a low value; de-activating, by the selection signal, the generation of a high-voltage signal, being supplied to the shifter, and a reference voltage signal; computing the difference between an internal voltage signal of the shifter, and the reference voltage signal; generating a control signal when the calculated difference is found to be less than a threshold voltage value; and applying the selection signal to an input terminal of the shifter in the presence of the control signal.

Another embodiment is directed to an improved self-controlled shifter, of the cascode type just described. The shifter may comprise a differential cell including an input section receiving a selection signal at an input terminal; and an output section in cascode configuration and having a reference node arranged to receive a reference voltage signal. The output section may comprise at least one MOS transistor connected between an internal circuit node and the output terminal. The self-controlled shifter may comprise a switching control device having a first input terminal connected to the reference node, a second input terminal connected to the internal circuit node, a third input terminal receiving the selection signal, and an output terminal connected to the input terminal of the shifter to output a controlled switch signal to the input terminal of the shifter.

BRIEF DESCRIPTION OF THE DRAWINGS

The features and advantages of the switching control method and improved self-controlled shifter according to this invention will be apparent from the following detailed description of an embodiment thereof, given by way of non-limitative example with reference to the accompanying drawings, in which:

FIGS. 4A to 4G are plots of characteristic signals of the self-controlled shifter shown in FIG. 3.

DETAILED DESCRIPTION OF THE PREFERRED EMBODIMENTS

Figure 1:
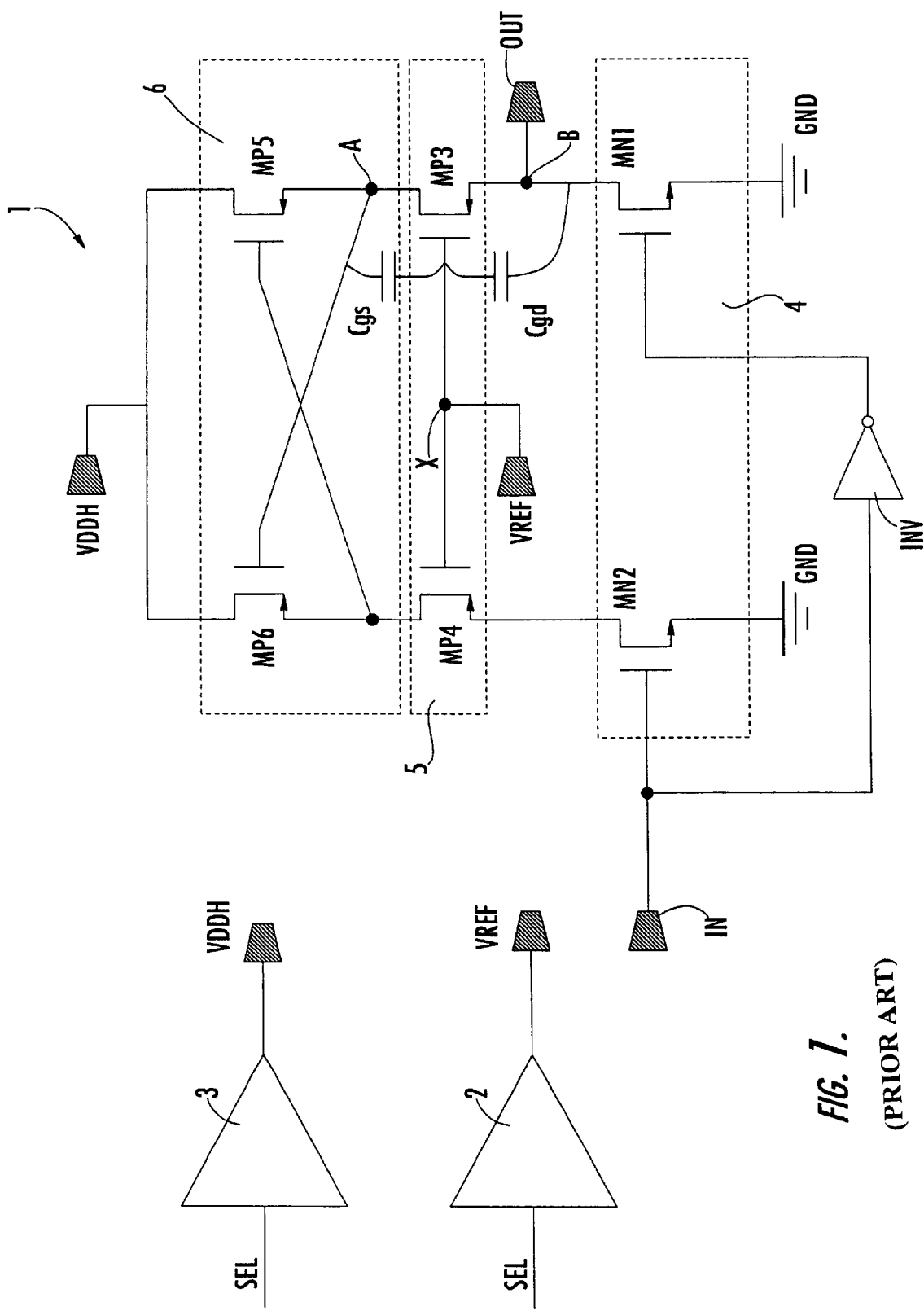
FIG. 1 shows schematically a cascode-type voltage shifter according to the prior art.
Figure 2A:
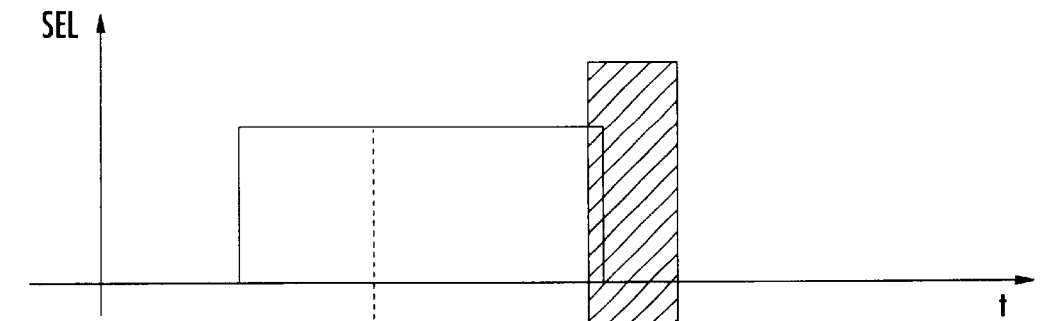
FIGS. 2A to 2D are plots of characteristic signals of the shifter shown in FIG. 1.
Figure 2B:
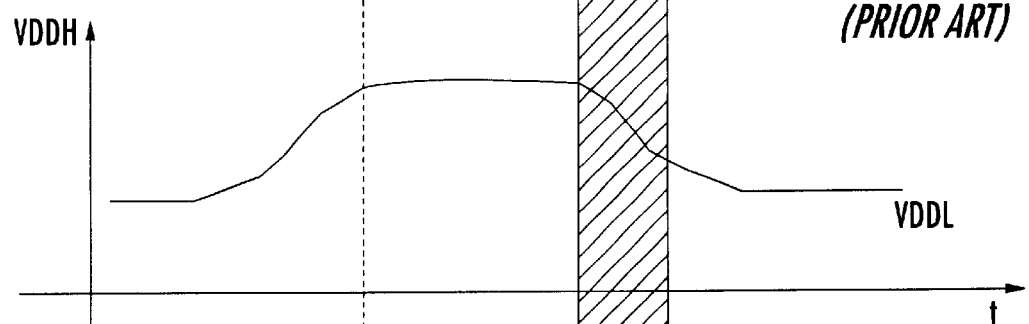
Figure 2C:
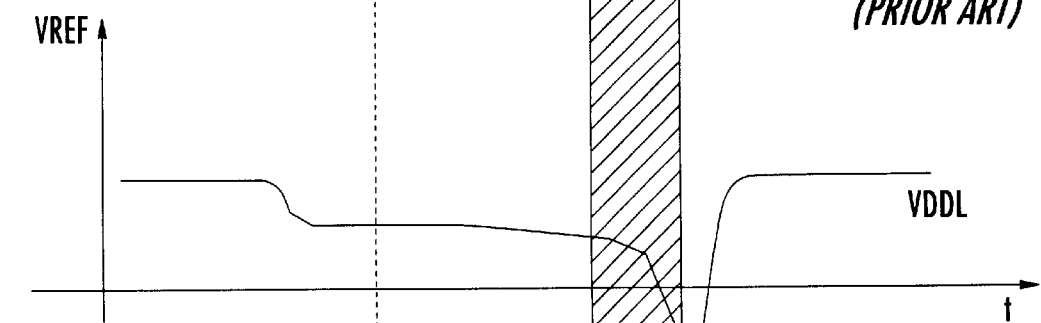
Figure 2D:
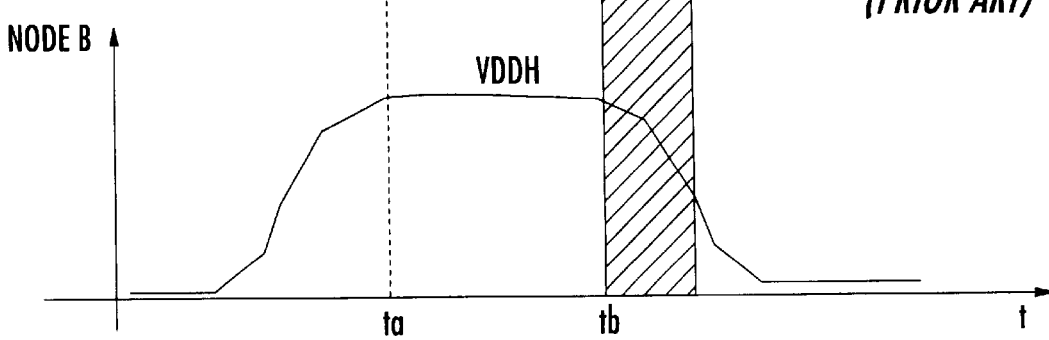
Figure 3:
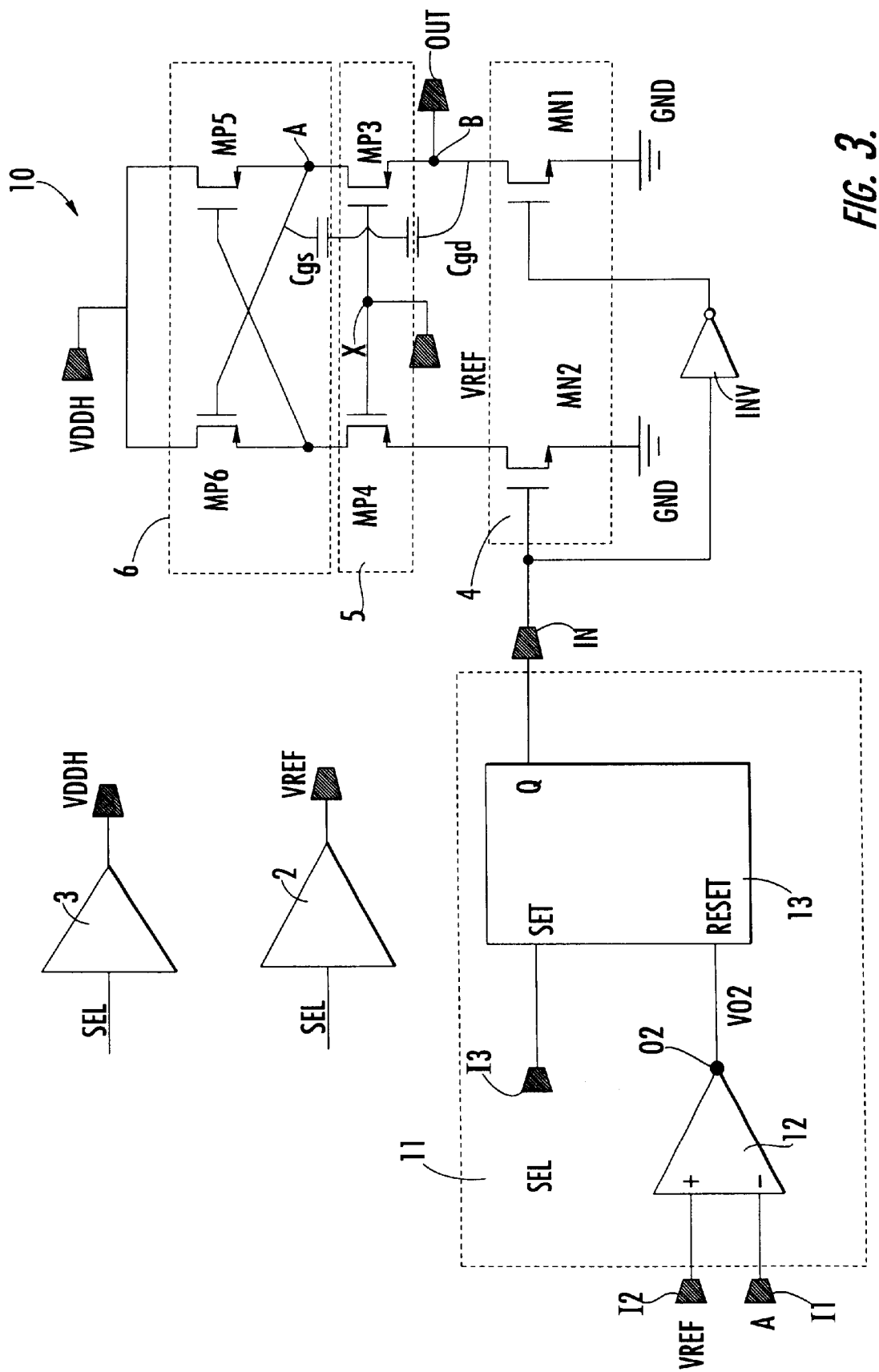
FIG. 3 shows schematically a self-controlled shifter incorporating a driver circuit, for implementing the control method according to the invention.

With reference to the above drawing, in particular to FIG. 3 thereof, a cascode-type shifter according to an embodiment of the invention is shown generally at 10 in schematic form. In particular, the shifter 10 is basically a cascode type of structure that is similar with to conventional shifters. Constructionally and functionally similar elements are denoted for simplicity by the same reference numerals as in the prior art illustration.

The shifter 10 comprises a differential cell having an input section 4, which comprises first and second MOS transistors MN1, MN2 and is connected to an input terminal IN of the shifter 10 as well as to a voltage reference, e.g. a ground GND. The shifter also includes an output section 5, which comprises third and fourth MOS transistors MP3, MP4 and is connected to the input section 4, as well as to an output terminal OUT of the shifter 10 and to a reference node X, the latter receiving a reference voltage VREF. The shifter 10 additionally includes a biasing section 6, which comprises fifth and sixth MOS transistors MP5, MP6 and is connected between the output section 5 and a high voltage reference VDDH.

In particular, the first transistor MN1 of the input section 4 has a drain terminal connected to the output terminal OUT, a source terminal connected to ground GND, and a gate terminal connected to the input terminal IN through an inverter INV. The second transistor MN2 of the input section 4 has a drain terminal connected to a drain terminal of the fourth transistor MP4 of the output section 5, a source terminal connected to ground GND, and a gate terminal connected to the input terminal IN directly.

Furthermore, the third transistor MP3 of the output section 5 has a source terminal connected to a first internal circuit node A, a drain terminal connected to the output terminal OUT of the shifter 10, and a gate terminal connected to the reference node X. The fourth transistor MP4 of the output section 5 has a source terminal connected to a drain terminal of the sixth transistor MP6 of the biasing section 6, a drain terminal connected to the drain terminal of the second transistor MN2 of the input section 4, and a gate terminal connected to the reference node X.

Lastly, the fifth transistor MP5 of the biasing section 6 has a drain terminal connected to the first internal circuit node A, a source terminal connected to the high voltage reference VDDH, and a gate terminal cross-connected to the drain terminal of the sixth transistor MP6. The latter has a source terminal connected to the high voltage reference VDDH, and a gate terminal cross-connected to the drain terminal of the fifth transistor MP5, i.e. to the first internal circuit node A. Thus, the third and fifth transistors MP3 and MP5, and the third and sixth transistors MP4 and MP6, are cascode connected. In particular, transistors MP3 and MP5 can be regarded to be an output leg of the differential cell.

As previously explained in relation to the prior art, the shifter 10 includes suitable generators 2, 3 for the reference voltage VREF and the high voltage VDDH, FIG. 3 only showing the operation of these generators. Advantageously according to an embodiment of the invention, a switching control device is associated with the shifter 10, specifically a driver circuit 11, having a first input terminal I1, a second input terminal I2 and a third input terminal I3, and having an output terminal connected to the input terminal IN of the shifter 10.

In particular, the driver circuit 11 comprises a comparator 12 having the first input terminal I1 as its inverting (−) input terminal which, in turn, is connected to the first internal circuit node A of the shifter 10. The comparator 12 has the second input terminal I2 as its non-inverting (+) input terminal which, in turn, is connected to the reference node X. An output terminal O2 is connected to an input terminal RESET of a sequential circuit 13, and whereat a control signal VO2 is supplied.

The sequential circuit 13 also has an input terminal SET connected to the third input terminal I3 of the driver circuit 11 and adapted to receive a selection signal SEL, which also turns on the generators 2 and 3 to generate voltage references VDDH and VREF. In addition, the circuit 13 has an output terminal Q connected to the input terminal IN of the shifter 10. The sequential circuit 13 is responsive to the rising edges of the input signals. The signal SEL is a selection/de-selection signal to the high voltages of the level shifter 10. The sequential circuit 13 may be a simple set/reset flip-flop.

As previously explained in relation to the prior art, when the output terminal OUT is switched to a low voltage value VDDL from a high voltage value VDDH, i.e as the high voltage VDDH is de-selected, a strong capacitive coupling appears at the output terminal OUT of the shifter 10 to the reference node X receiving the reference voltage VREF. This capacitive coupling may be very important especially with level shifters 10 that afford high drive capabilities.

To afford a high drive capability, the level shifter 10 should desirably include: 1) large-size PMOS transistors in the cascoded output branch, i.e. MP4 and MP3 must be large, and accordingly, large associated gate-source and gate-drain capacitances Cgs and Cgd; and 2) a fairly low reference voltage value VREF, so that the third transistor MP3 allows a large current to flow throughout when the gate-source voltage, expressed as its absolute value (|Vgs|), has a high value.

As previously explained in relation to the prior art, feature 1) above augments the capacitive coupling to the reference node X, resulting in undesired variation of the reference voltage VREF. Feature 2) above may even produce a negative reference voltage VREF, resulting in stress and bias problems with the affected transistors.

The control method according to an embodiment of the invention comprises a phase of de-selection of the high voltage VDDH in the shifter 10, which is modified from the prior art. In conventional shifters, the phase of de-selection of the output terminal OUT under a high-voltage condition comprises sending the selection signal SEL directly to the input terminal IN of the shifter. This causes the node A to drop to ground, node A following the output terminal OUT.

It should be noted that the de-selection phase is carried out conventionally with the transistor MP3 still in the 'on' condition, ahead of the positive reaction from the left branch of the level shifter. The reaction delay is due to the finite internal switching time of the shifter. The de-selection phase is, therefore, carried out before the level of the reference voltage VREF can be restored on the reference node X.

Advantageously in the control method according to an embodiment of the invention, the de-selection phase is carried out with the transistor MP3 in the 'off' condition, or more generally, in a low-voltage condition. Accordingly, the first internal circuit node A will not follow the output terminal OUT upon de-selection.

Advantageously according to an embodiment of the invention, the de-selection phase comprises applying the selection signal SEL to an input of the sequential circuit 13 in the driver circuit 11, the sequential circuit 13 being also connected to the input terminal IN. In particular, the sequential circuit 13 allows the selection signal SEL to be applied to the input terminal IN of the shifter 10 only in the presence of the control signal VO2 being issued from the comparator 12, by comparing together the signals A and VREF being input to it. When the level shifter 10 is switched to a high voltage (at time ta in FIGS. 4A to 4G), the driver circuit 11 is transparent, because the selection signal SEL now affects the shifter 10 directly (IN=SEL)

In switching from a high to a low voltage (time tb in FIGS. 4A to 4G), the selection signal SEL has no direct effect on the level shifter 10, it only affects the generators 2, 3 of the high voltage VDDH and the reference voltage VREF. The reference voltage VREF, in fact, should go high to turn off the third transistor MP3, at the same time as the high voltage VDDH should go low in order to facilitate switching of the output terminal OUT to ground.

Advantageously according to an embodiment of the invention, the comparator 12, which is connected to the first internal circuit node A to receive the reference voltage VREF, is calibrated to switch when the difference between its input values becoming smaller than the threshold of transistor MP3 (taking account of the body effect in the transistor), i.e. when:

$$\Delta Vin=VA-VREF<|Vth(MP3)|.$$

As this condition is established, the comparator output terminal OUT goes high (time tc in FIGS. 4A to 4G), and supplies the reset signal RESET to the sequential circuit 13. The driver circuit 11 causes the signal IN to be switched on, thereby ending the operation of charging the output terminal OUT. In this case, the coupling capacitance to the reference node X is merely the gate-drain capacitance Cgd of the third transistor MP3, with the gate-source capacitance Cgs of transistor MP3 being "filtered" out. Advantageously according to an embodiment of the invention, the gate-source capacitance Cgs of the third transistor MP3 effectively opposes the drop across the reference node X because one of its electrodes (the first internal circuit node A) is connected to a value that is set equal to the high voltage VDDH (or VDDL, when in a low-voltage condition).

To summarize, the shifter 10, comprising the driver circuit 11 to implement the control method according to an embodiment of the invention, will be self-controlled during the high-voltage de-selections. To illustrate the advantages of the control method and the self-controlled shifter according to embodiments of the invention, there follows a comparative review of the operation of conventional devices.

During the dynamic de-selection phase in prior art shifters, the gate-drain and gate-source capacitances Cgd and Cgs, respectively, of the third transistor MP3 are 'virtually' in parallel, on account of their electrodes being connected to two nodes that are at the same transition low level. Any effects due to parasitic capacitances of the fifth transistor MP5 can be ignored for the same reasons as have been given with respect to the gate-source capacitance Cgs of the third transistor MP3.

The current variation ΔIREF available at the output of the reference generator 2 is both dependent on the coupling capacitance and the voltage variation timetable at the nodes to which it is connected, according to the following relation:

$$\Delta IREF = C \times |(\Delta VREF - \Delta VOUT)|/dt$$

where, C is the coupling capacitance to the reference node X, ΔVOUT is the voltage variation at the output terminal OUT during the de-selection switch, and ΔVREF is the voltage variation at the reference node X.

Assuming as stable as possible of the value for the reference voltage VREF, the variation of IREF will depend only upon the factor ΔVOUT/dt.

Taking the selection phase as being carried out in accordance with the inventive control method, and labelling with "*" all the quantities involved in the control method and the self-controlled shifter according to embodiments of the invention, coupling capacitance C* is much smaller than conventional, and the value of the voltage variation absolute value ΔVOUT at the output terminal OUT is equal to the low voltage VDDL, rather than to the high voltage VDDH as in the prior art.

In particular, a diminished value by a factor n (smaller coupling) can be assumed for the coupling capacitance C*, and a diminished value by a factor m (low-voltage de-selection) assumed for the voltage variation ΔVOUT*. Therefore, an improvement (specifically, a decrease) by m×n is obtained in the variation value of ΔIREF, i.e.:

$$\Delta IREF^* = (1/n \times m)\Delta IREF.$$

As to the voltage variations at the reference node X, they can be related to the current variation ΔIREF directly, as follows:

$$\Delta VREF = \Delta IREF \times Zout$$

where, Zout is the generic output impedance of the generator 2 generating the reference voltage VREF, which impedance should be high, if the general design of the shifter 10 should not become too elaborate and the currents should be kept small (i.e. low-power applications are envisaged).

As explained above in connection with the variations of IREF, a diminished de-selection impact (1/m×n) is to be found on the variation of the reference voltage VREF as well. In particular, the following relation applies:

$$\Delta VREF^* = (1/n \times m)\Delta VREF.$$

Finally, a qualitative analysis of the relative variation at the reference node X will show the advantages of the control method according to an embodiment of the invention. In particular, the following relations follow inter alia from the foregoing relations:

$$\Delta VREF_{REL} = \Delta VREF/VREF = \Delta IREF/IREF \times ZOUT, \text{ as for the prior art, and}$$

$$\Delta VREF^*_{REL} = \Delta VREF^*/VREF^* << \Delta VREF, \text{ as for the inventive method.}$$

Additionally to having an advantageously attenuated variation ΔVREF*, for the reasons given above, an important benefit comes from the relative voltage variation ΔVREF*$_{REL}$ being made smaller yet since the starting value of the reference voltage VREF* is higher in a "near-steady state" condition. This is due to the fact that the voltage variation ΔVOUT* at the output terminal OUT occurs after the reference voltage VREF* reaches the low voltage value VDDL (it being VDDL>VREF).

The control method according to an embodiment of the invention offers the following additional advantages:

1) in a way, it frees from the demand drive capability on the level shifter 10, and so from the gate-drain and gate-source capacitances Cgd(MP3) and Cgs(MP3) of the third transistor MP3 because their effects are filtered out;
2) it is more effective than, for example, a simple delay network for a controlled de-selection, because it is self-controlled and its design is not constrained by the circuit to be controlled;
3) it can be applied to internal references, in the instance of more complex cascoded circuits, and in all cases to de-selecting fairly "ponderous" high-voltage nodes;
4) it allows the generator 2 of reference voltage VREF to be dimensioned to supply smaller currents, lowering consumption and space requirements;
5) it does not require external control signals, and corresponding synchronization problems, the one signal required being the high-voltage de-selection signal SEL, which in all cases would be there already;
6) it can also be applied to bias de-selection situations involving "ponderous" nodes, such as bitlines in sense amplifiers of memories, or wordlines in row drivers, showing therefore to be 'all-purpose'.

An exemplary application of the control method according to an embodiment of the invention is to the non-volatile memory testing procedure known as 'drain stress'. That testing procedure comprises selection followed by simultaneous de-selection of all the bitlines in the array, and accordingly, all the level shifters connected to them.

The size of the transistors corresponding to the above referred MP1 and MP3 usually must be large due to the high drive capability required, and because they are also used for transferring the high voltage during the programming phase, when large currents (program currents) are required. In this case, the values of the associated parasitic capacitances may be very high, and the capacitive coupling in conventional devices could turn out to be destructive. This problem is addressed by the use of the self-controlled shifter according to FIG. 3. It should be noted, for simplicity, that the shifter is described as cascoded relative to the PMOS portion alone, but the considerations made about its basic operation would also apply to more complex shifters, and in general, to high-voltage de-selection circuits requiring high drive capabilities.

From the foregoing it will be appreciated that, although specific embodiments of the invention have been described herein for purposes of illustration, various modifications may be made without deviating from the spirit and scope of the invention. Accordingly, the invention is not limited except as by the appended claims.

That which is claimed is:

1. A switching control method for a level shifter including a phase of de-selection of a high voltage value at an output terminal of the level shifter using a selection signal, the de-selection phase comprising:

starting the de-selection by bringing the selection signal to a low value;

de-activating by the selection signal, generation of a high-voltage signal to be supplied to the level shifter, and a reference voltage signal;

computing a difference between an internal voltage signal of the level shifter and the reference voltage signal;

generating a control signal when the difference is less than a threshold voltage value; and applying the selection signal to an input terminal of the shifter in the presence of the control signal.

2. A method according to claim 1, wherein in high-voltage conditions with the selection signal at a high level, the selection signal is applied to the input terminal directly.

3. A method according to claim 1, wherein the internal voltage signal corresponds to a voltage value at a node which is a source terminal of a MOS transistor of a cascoded structure internal to the level shifter, and wherein said MOS transistor also has a drain terminal connected to an output terminal of the level shifter and a gate terminal connected to a reference node arranged to receive the reference voltage signal.

4. A method according to claim 1, wherein the difference between the internal voltage signal and the reference voltage signal, and the generation of the control signal, are obtained using a comparator which is input the reference voltage signal and the internal voltage signal and which outputs the control signal, and wherein the comparator is calibrated to switch as a difference between its input values drops below the threshold voltage value.

5. A switching control method for a level shifter comprising:

starting a de-selection by bringing a selection signal to a first value;

de-activating by the selection signal, generation of a high-voltage signal to be supplied to the level shifter, and a reference voltage signal;

computing a difference between an internal voltage signal of the level shifter and the reference voltage signal; and applying the selection signal to an input terminal of the shifter based upon the difference being below a threshold voltage value.

6. A method according to claim 5, wherein in high-voltage conditions with the selection signal at a high level, the selection signal is applied to the input terminal directly.

7. A method according to claim 5, wherein the internal voltage signal corresponds to a voltage value at a node which is a source terminal of a MOS transistor of a cascoded structure internal to the level shifter, and wherein said MOS transistor also has a drain terminal connected to an output terminal of the level shifter and a gate terminal connected to a reference node arranged to receive the reference voltage signal.

8. A method according to claim 5, wherein the difference between the internal voltage signal and the reference voltage signal, and the generation of the control signal, are obtained using a comparator which is input the reference voltage signal and the internal voltage signal and which outputs the control signal, and wherein the comparator is calibrated to switch as a difference between its input values drops below the threshold voltage value.

9. A self-controlled level shifter comprising:

a differential cell comprising an input terminal and an input section connected thereto, and an output section in a cascode configuration and having a reference node receiving a reference voltage signal, said output section comprising an internal circuit node, an output terminal and at least one MOS transistor connected between the internal circuit node and the output terminal; and a switching control device having a first input terminal connected to the reference node, a second input terminal connected to the internal circuit node, a third input terminal receiving a selection signal, and an output terminal connected to the input terminal of said differential cell to provide a controlled switch signal thereto.

10. A self-controlled level shifter according to claim 9, wherein said switching control device comprises a comparator having an inverting input defining the first input terminal and a non-inverting input defining the second input terminal, and having an output.

11. A self-controlled level shifter according to claim 10, wherein said switching control device further comprises a sequential circuit having a first input connected to the third input terminal, a second input connected to the output of said comparator, and an output defining the output terminal of said switching control device.

12. A self-controlled level shifter according to claim 11, wherein said sequential circuit comprises a set/reset flip-flop.

13. A self-controlled level shifter according to claim 10, wherein said comparator is calibrated for switching as a difference between its input values drops below a threshold voltage value of said at least one MOS transistor and based upon a body effect thereof.

14. An integrated circuit comprising:

a level shifter comprising a differential cell and a switching control device connected thereto;

said differential cell comprising an input terminal and an input section connected thereto, and an output section in a cascode configuration and having a reference node receiving a reference voltage signal, an internal circuit node and an output terminal;

said switching control device having a first input terminal connected to the reference node, a second input terminal connected to the internal circuit node, a third input terminal receiving a selection signal, and an output terminal connected to the input terminal of said differential cell to provide a controlled switch signal thereto.

15. An integrated circuit according to claim 14, wherein said switching control device comprises a comparator having an inverting input defining the first input terminal and a non-inverting input defining the second input terminal, and having an output.

16. An integrated circuit according to claim 15, wherein said switching control device further comprises a sequential circuit having a first input connected to the third input terminal, a second input connected to the output of said comparator, and an output defining the output terminal of said switching control device.

17. An integrated circuit according to claim 16, wherein said output section comprises at least one MOS transistor; and wherein said comparator is calibrated for switching as a difference between its input values drops below a threshold voltage value of said at least one MOS transistor and based upon a body effect thereof.

18. An integrated circuit according to claim 16, wherein said sequential circuit comprises a set/reset flip-flop.

* * * * *